US009760303B2

(12) United States Patent

Ea et al.

(10) Patent No.: US 9,760,303 B2

(45) Date of Patent: Sep. 12, 2017

(54) PARTIALLY-BAD BLOCK OPERATION IN 3-D NONVOLATILE MEMORY

(71) Applicant: SanDisk Technologies LLC, Plano, TX (US)

(72) Inventors: Dennis S. Ea, Hayward, CA (US); Ivan Baran, San Jose, CA (US); Aaron Lee, Mountain View, CA (US); Mrinal Kochar, San Jose, CA (US); Mikhail Palityka, Ontario (CA); Yew Yin Ng, Milpitas, CA (US); Abhijeet Bhalerao, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 127 days.

(21) Appl. No.: 14/869,686

(22) Filed: Sep. 29, 2015

(65) Prior Publication Data

US 2017/0090762 A1 Mar. 30, 2017

(51) Int. Cl.

| | |
|---|---|
| ***G06F 12/00*** | (2006.01) |
| ***G06F 3/06*** | (2006.01) |
| ***G11C 11/56*** | (2006.01) |
| ***G11C 16/04*** | (2006.01) |
| ***G11C 29/00*** | (2006.01) |
| *G06F 12/02* | (2006.01) |
| *G06F 11/10* | (2006.01) |

(52) U.S. Cl.

CPC ............ *G06F 3/064* (2013.01); *G06F 3/0604* (2013.01); *G06F 3/065* (2013.01); *G06F 3/0667* (2013.01); *G06F 3/0679* (2013.01); *G11C 11/5621* (2013.01); *G11C 16/0483* (2013.01); *G11C 29/76* (2013.01); *G11C 29/765* (2013.01); *G11C 29/808* (2013.01); *G11C 29/82* (2013.01); *G11C 29/88* (2013.01); *G06F 11/1048* (2013.01); *G06F 12/0246* (2013.01); *G06F 2212/7201* (2013.01); *G06F 2212/7204* (2013.01); *G06F 2212/7206* (2013.01)

(58) Field of Classification Search

CPC ..... G06F 3/0617; G06F 3/0685; G06F 3/0647

USPC .......................................................... 711/103

See application file for complete search history.

(56) References Cited

U.S. PATENT DOCUMENTS

| | | | |
|---|---|---|---|
| 8,732,519 | B2 | 5/2014 | Sun et al. |
| 8,966,330 | B1 | 2/2015 | Raghu et al. |
| 2002/0114178 | A1 | 8/2002 | Sakui |

(Continued)

FOREIGN PATENT DOCUMENTS

| | | | |
|---|---|---|---|
| WO | 2014047225 | A1 | 3/2014 |

OTHER PUBLICATIONS

International Search Report and Written Opinion mailed Aug. 4, 2016, International Application No. PCT/US2016/036739, filed Jun. 9, 2016.

*Primary Examiner* — Jae Yu

(74) *Attorney, Agent, or Firm* — Foley & Lardner LLP

(57) ABSTRACT

Partially-bad blocks are identified in a 3-D block-erasable nonvolatile memory, each partially-bad block having one or more inoperable separately-selectable sets of NAND strings and one or more operable separately-selectable sets of NAND strings. Operable sets of NAND strings within two or more partially-bad blocks are identified and are mapped to form one or more virtual blocks that are individually assigned virtual block addresses. The virtual block address are maintained in a list and used to access the virtual blocks.

16 Claims, 14 Drawing Sheets

(56) References Cited

U.S. PATENT DOCUMENTS

| | | | |
|---|---|---|---|
| 2008/0034252 A1 | 2/2008 | Aoyagi et al. | |
| 2009/0089482 A1 | 4/2009 | Traister | |
| 2010/0161880 A1 | 6/2010 | You | |
| 2012/0047409 A1 * | 2/2012 | Post | G06F 11/1048 714/718 |
| 2014/0143593 A1 | 5/2014 | Strauss et al. | |
| 2015/0187442 A1 | 7/2015 | Sivasankaran et al. | |
| 2015/0262698 A1 | 9/2015 | Shirakawa | |

* cited by examiner

Programming into four states represented by a 2-bit code

PARTIALLY-BAD BLOCK OPERATION IN 3-D NONVOLATILE MEMORY

BACKGROUND

This application relates to the operation of re-programmable nonvolatile memory such as semiconductor flash memory.

Solid-state memory capable of nonvolatile storage of charge, particularly in the form of EEPROM and flash EEPROM packaged as a small form factor card, has become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) to be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Nonvolatile memory devices are also manufactured from memory cells with a dielectric layer for storing charge. Instead of the conductive floating gate elements described earlier, a dielectric layer is used. An ONO dielectric layer extends across the channel between source and drain diffusions. The charge for one data bit is localized in the dielectric layer adjacent to the drain, and the charge for the other data bit is localized in the dielectric layer adjacent to the source. Multi-state data storage is implemented by separately reading the binary states of the spatially separated charge storage regions within the dielectric.

Many nonvolatile memories are formed along a surface of a substrate (e.g. silicon substrate) as two dimensional (2D), or planar, memories. Other nonvolatile memories are three dimensional (3-D) memories that are monolithically formed in one or more physical levels of memory cells having active areas disposed above a substrate.

SUMMARY

A block in a three-dimensional nonvolatile memory may include multiple separately-selectable sets of strings. In some examples, one or more of such sets of strings may be inoperable and may fail testing while other sets of strings in the same block are operable and may pass testing. Operable sets of strings from two or more such partially-bad blocks may be mapped to form a virtual block that is assigned a virtual block address and is operated as a unit. Virtual blocks are equal in size to good physical blocks. This allows a memory management system to operate with blocks of equal data storage capacity even though the partially-bad blocks used to form virtual blocks each have reduced data storage capacity. Data in virtual blocks may be stored with higher redundancy than data stored in good blocks. Data in virtual blocks may be stored in SLC format only (where good blocks store at least some MLC data). Data in virtual blocks may store specific types of data, or may otherwise be operated in a manner that is different from good blocks.

An example of a method of operating a 3-D block-erasable nonvolatile memory formed in a plurality of levels of memory cells disposed above a substrate, each block having n separately-selectable sets of NAND strings connected in parallel includes: identifying a plurality of partially-bad blocks, each partially-bad block having one or more inoperable separately-selectable sets of NAND strings and one or more operable separately-selectable sets of NAND strings; identifying operable sets of NAND strings within the partially-bad blocks; mapping operable separately-selectable sets of NAND strings from two or more blocks to form one or more virtual blocks, each virtual block consisting of n separately-selectable sets of NAND strings; assigning virtual block addresses individually to the one or more virtual blocks; subsequently, maintaining the virtual block addresses in a list; and subsequently, accessing the virtual blocks by the virtual block addresses.

The memory may further include good blocks that contain only operable separately-selectable sets of NAND strings. The list may be an available block list that includes addresses of the good blocks, the good blocks and the virtual blocks being equally available for storage of data. Data may be stored in the virtual blocks using a first redundancy scheme and data may be stored in the good blocks using a second redundancy scheme, the first redundancy scheme having greater error correction capacity than the second redundancy scheme. Data may be stored in the virtual blocks in single level cell (SLC) format only and data may be stored in at least some of the good blocks in multi-level cell (MLC) format. The memory may further include bad blocks that contain more than a threshold number of inoperable separately-selectable sets of NAND strings. A logical-to-physical map may be maintained for data stored in the memory, the logical-to-physical map including an entry for each good block, an entry for each partially-bad block, and no entry for any bad block. An individual virtual block may be marked obsolete as a unit and may subsequently be erased in a plurality of erase operations directed to the partially-bad blocks containing the separately-selectable sets of NAND strings forming the individual virtual block. The list may be a list of scratch-pad blocks that are used only for short-term storage of small portions of data that are later copied to other locations.

An example of a method of operating a 3-D nonvolatile memory formed in a plurality of levels of memory cells disposed above a substrate that are erasable in physical blocks, each physical block having n separately-selectable sets of vertical NAND strings includes: identifying a plurality of partially-bad blocks from among blocks failing to meet test criteria, each partially-bad block having one or more inoperable separately-selectable sets of NAND strings and one or more operable separately-selectable sets of NAND strings; identifying operable sets of NAND strings within the partially-bad blocks; mapping operable separately-selectable sets of NAND strings from two or more blocks to form a virtual block, the virtual block consisting of n separately-selectable sets of NAND strings; assigning a virtual block address to the virtual block; subsequently, maintaining the virtual block address in a spare block list; and subsequently, accessing the virtual block by the virtual block address only when blocks meeting test criteria are not available.

The n separately-selectable sets of vertical NAND strings of a physical block may be physically ordered from position 1 to n and the separately-selectable sets of vertical NAND strings forming the virtual block may be selected to include one separately-selectable set of vertical NAND strings from each position 1 to n. The n separately-selectable sets of vertical NAND strings of a physical block may be physically ordered from position 1 to n and the separately-selectable sets of vertical NAND strings forming the virtual block may be selected without regard to physical position. Data may be stored in the virtual block in a lower density format than data stored in blocks that meet test criteria. Data may be stored in the virtual block with a higher degree of redundancy than data stored in blocks that meet test criteria.

An example of a nonvolatile memory system includes: a three-dimensional nonvolatile memory array that is monolithically formed in a plurality of physical levels of memory cells disposed above a substrate, and including a plurality of separately-erasable physical blocks, each physical block having n separately-selectable sets of vertical NAND strings; a first subset of the plurality of physical blocks that meet predetermined criteria; a second subset of the plurality of physical blocks that fail to meet the predetermined criteria; a third subset of the plurality of physical blocks that fail to meet the predetermined criteria, and are each found to contain at least one operable separately-selectable set of vertical NAND strings; a plurality of virtual blocks, an individual virtual block formed from operable separately-selectable sets of vertical NAND strings from two or more blocks from the third subset of the plurality of physical blocks, each virtual block having a unique virtual block address; and a mapping unit that maps virtual block addresses to the separately-selectable sets of vertical NAND strings that form the virtual block so that access operations directed to a virtual block address are remapped to the separately-selectable sets of vertical NAND strings that form the virtual block.

The n separately-selectable sets of vertical NAND strings of a physical block may be physically ordered from position 1 to n and the separately-selectable sets of vertical NAND strings forming the virtual block may include one separately-selectable set of vertical NAND strings from each position 1 to n. A block selection unit may select an available block for storage of new data, the block selection unit configured to only select virtual blocks when no block from the first subset of the plurality of blocks is available. A redundancy unit may be configured to encode data with redundancy prior to storage, the redundancy unit configured to apply a lower level of redundancy to data stored in the first subset of the plurality of physical blocks and configured to apply a higher level of redundancy to data stored in the third subset of the plurality of physical blocks, the higher level of redundancy having capacity to correct a higher number of errors than the lower level of redundancy. The three-dimensional nonvolatile memory array may be located on a first die, and the mapping unit and the redundancy unit may be located on a second die. The first die and the second die may be mounted on a printed circuit board in a memory system that is: a universal serial bus (USB) memory, a memory card, or a solid state drive.

Various aspects, advantages, features and embodiments are included in the following description of exemplary examples thereof, which description should be taken in conjunction with the accompanying drawings.

DETAILED DESCRIPTION

Memory System

Figure 1:
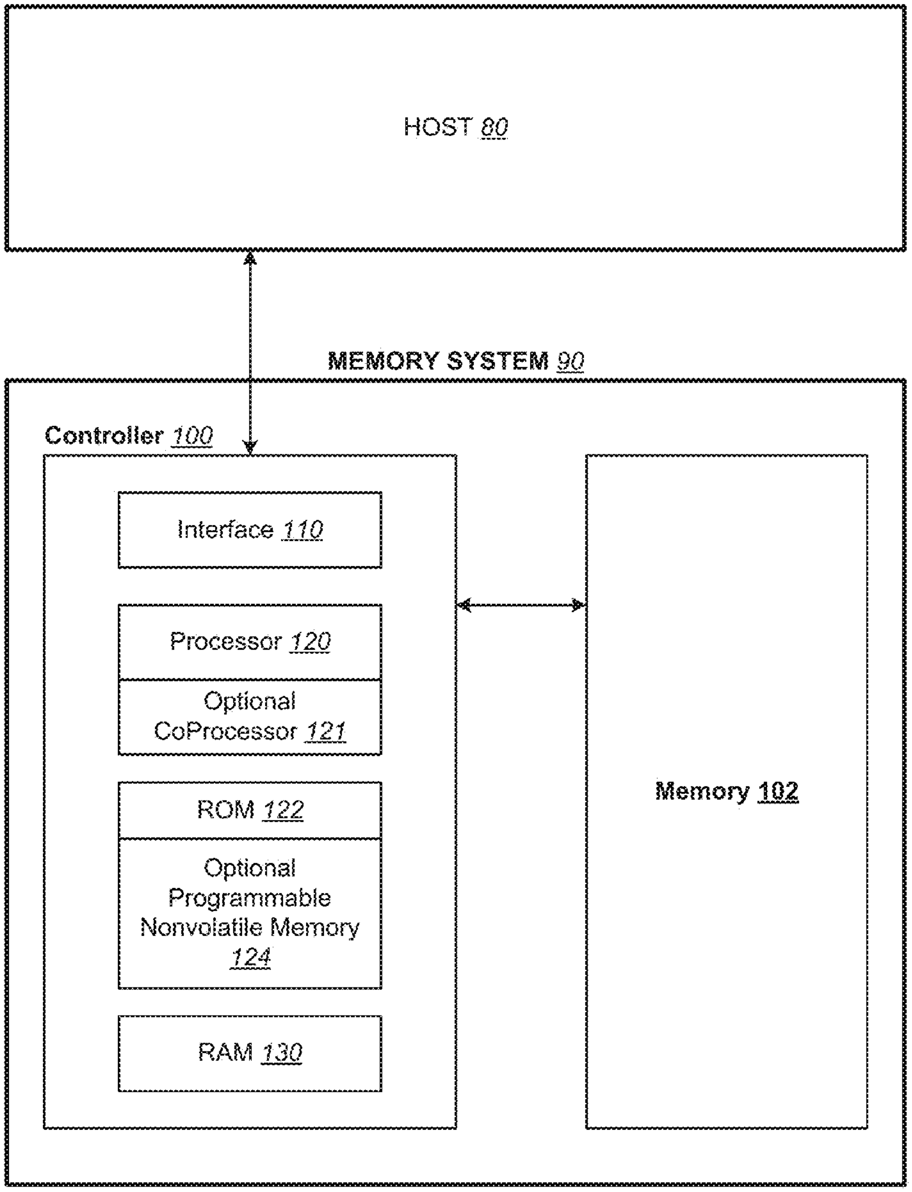
FIG. 1 illustrates schematically the main hardware components of a memory system.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

FIG. 1 illustrates schematically the main hardware components of a memory system suitable for implementing some of the techniques described here. The memory system 90 typically operates with a host 80 through a host interface. The memory system may be in the form of a removable memory such as a memory card, or may be in the form of an embedded memory system. The memory system 90 includes a memory 102 whose operations are controlled by a controller 100. The memory 102 comprises one or more array of non-volatile memory cells distributed over one or more integrated circuit chip. The controller 100 may include interface circuits 110, a processor 120, ROM (read-only-memory) 122, RAM (random access memory) 130, programmable nonvolatile memory 124, and additional components. The controller is typically formed as an ASIC (application specific integrated circuit) and the components included in such an ASIC generally depend on the particular application. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

Physical Memory Structure

Figure 2:
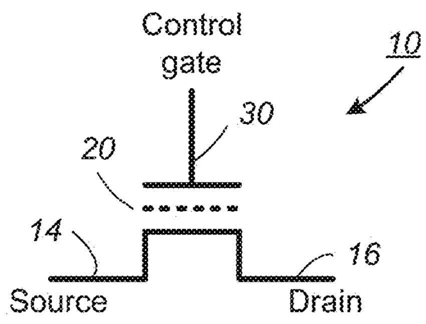
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a charge trapping (dielectric) layer. The memory cell 10 also includes a source 14, a drain 16, and a control gate 30.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current (cell-read reference current). In one implementation the detection of the conduction current relative to a threshold current is accomplished by examining the rate the conduction current is discharging through the capacitance of the bit line.

Figure 3:
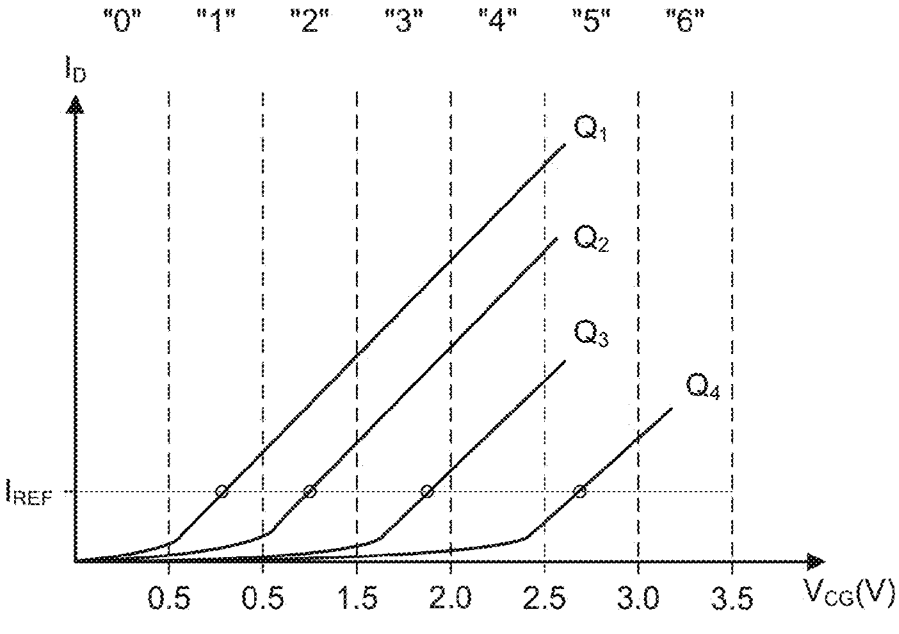
FIG. 3 illustrates the relation between the source-drain current $I_D$ and the control gate voltage $V_{CG}$ for four different charges Q1-Q4 that a floating gate may store.

FIG. 3 illustrates the relation between the source-drain current $I_D$ and the control gate voltage $V_{CG}$ for four different charges Q1-Q4 that the floating gate may be selectively storing at any one time. With fixed drain voltage bias, the four solid $I_D$ versus $V_{CG}$ curves represent four of seven possible charge levels that can be programmed on a floating gate of a memory cell, respectively corresponding to four possible memory states. As an example, the threshold voltage window of a population of cells may range from 0.5V to 3.5V. Seven possible programmed memory states “0”, “1”, “2”, “3”, “4”, “5”, “6”, and an erased state (not shown) may be demarcated by partitioning the threshold window into regions in intervals of 0.5V each. For example, if a reference current, IREF of 2 μA is used as shown, then the cell programmed with Q1 may be considered to be in a memory state “1” since its curve intersects with $I_{REF}$ in the region of the threshold window demarcated by VCG=0.5V and 1.0V. Similarly, Q4 is in a memory state “5”.

As can be seen from the description above, the more states a memory cell is made to store, the more finely divided is its threshold voltage window. For example, a memory device may have memory cells having a threshold voltage window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

NAND Structure

Figure 4A:
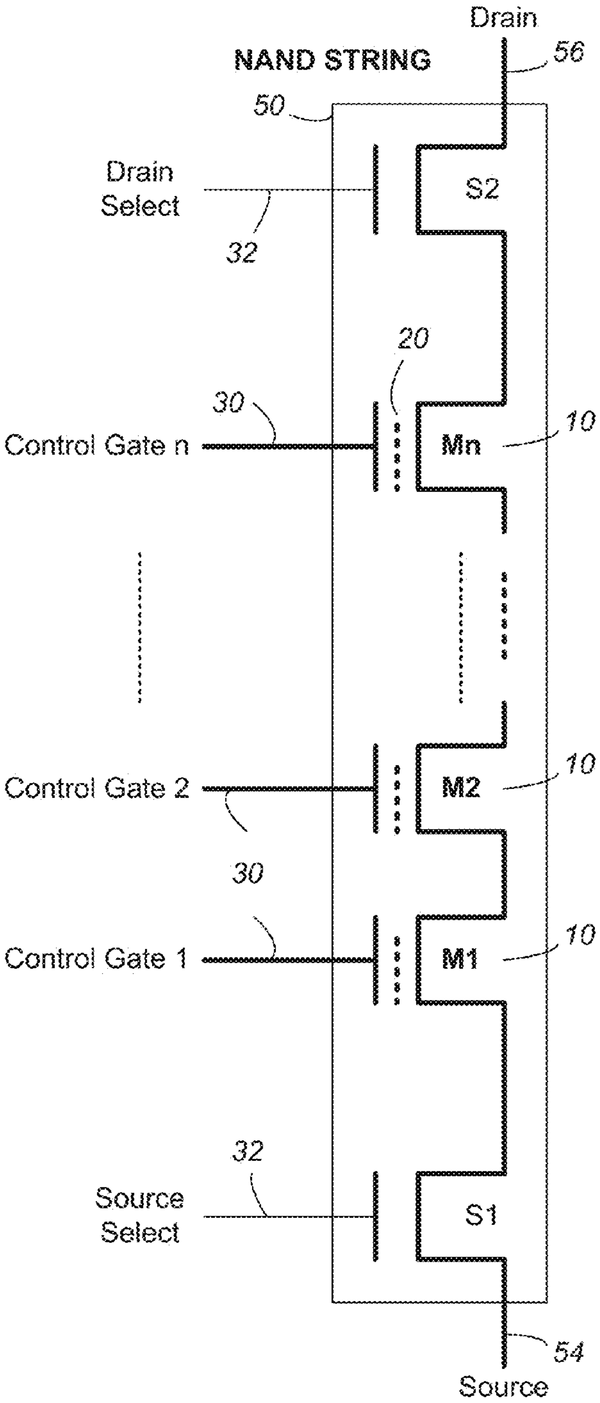
FIG. 4A illustrates schematically a string of memory cells organized into a NAND string.

FIG. 4A illustrates schematically a string of memory cells organized into a NAND string. A NAND string 50 comprises a series of memory transistors M1, M2, . . . Mn (e.g., n=4, 8, 16 or higher) daisy-chained by their sources and drains. A pair of select transistors S1, S2 controls the memory transistor chain’s connection to the external world via the NAND string’s source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within a NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effectively created from the source of the individual memory transistor to the source terminal 54 of the NAND string and likewise for the drain of the individual memory transistor to the drain terminal 56 of the cell.

Figure 4B:
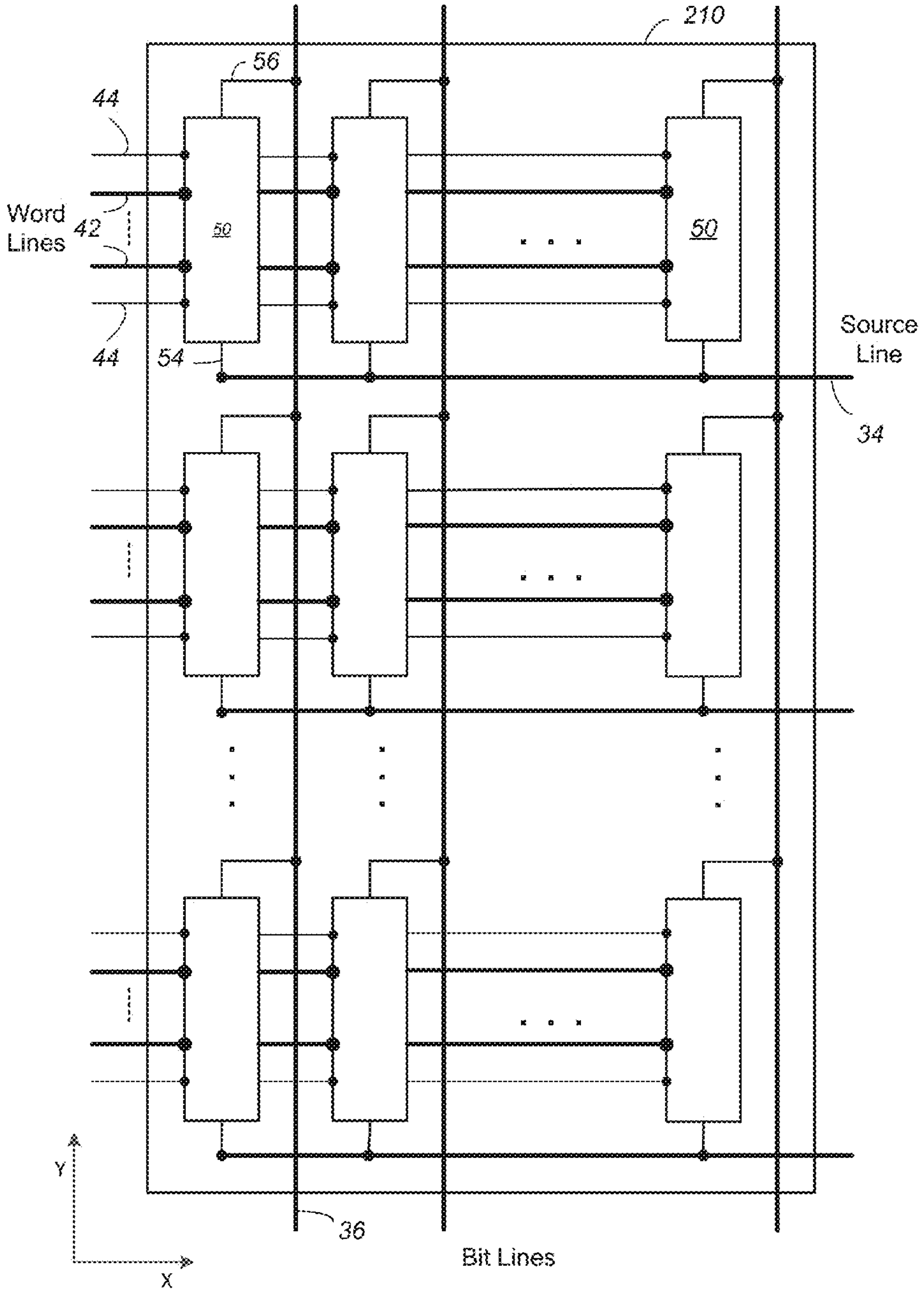
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. Along each column of NAND strings, a bit line such as bit line 36 is coupled to the drain terminal 56 of each NAND string. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
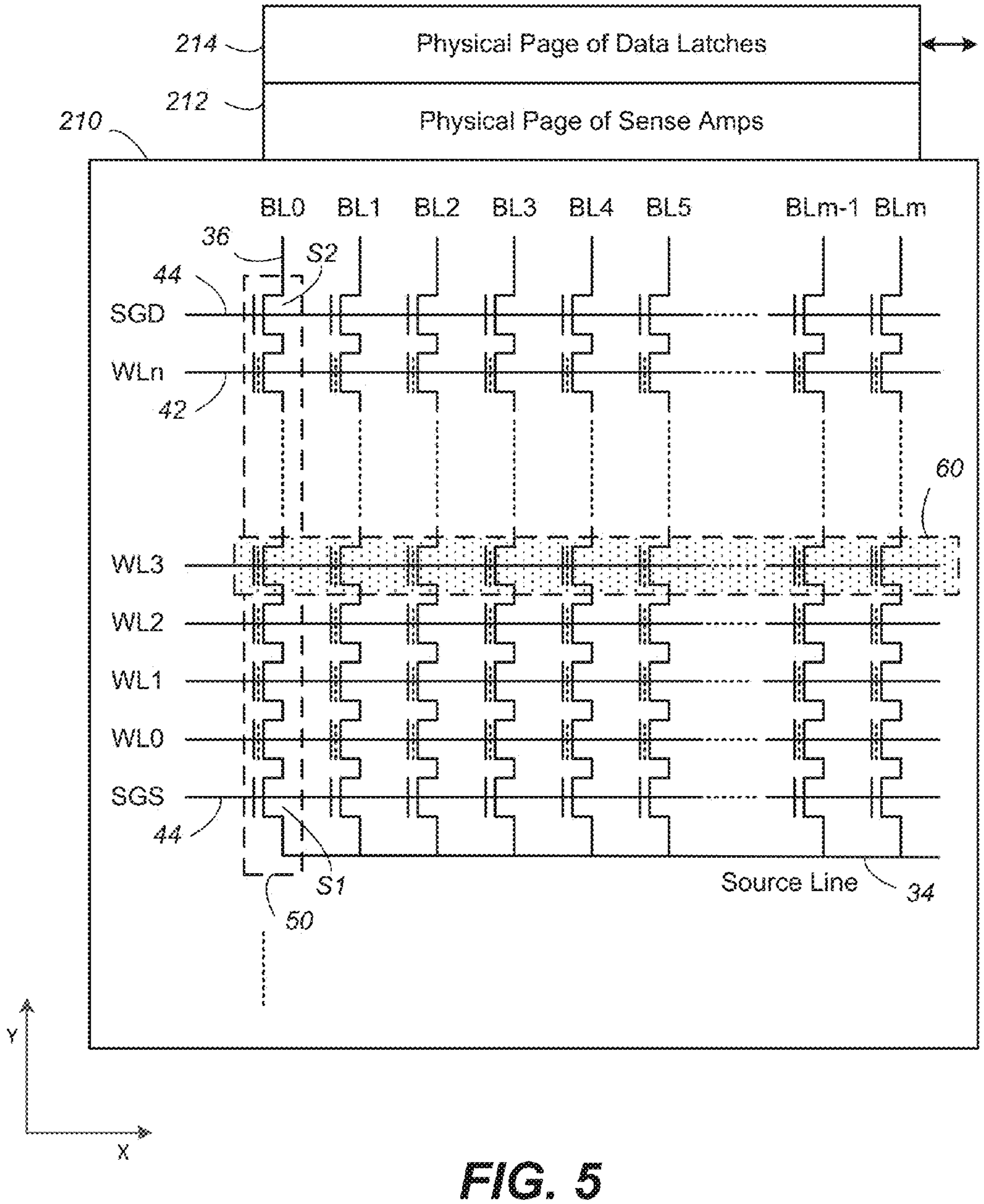
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36. As an example, when respectively sensing or programming the page of cells 60, a sensing voltage or a programming voltage is respectively applied to the common word line WL3 together with appropriate voltages on the bit lines.

Physical Organization of the Memory

One difference between flash memory and other of types of memory is that a flash memory cell is generally programmed from the erased state. That is the floating gate is generally first emptied of charge. Programming then adds a desired amount of charge back to the floating gate. Flash memory does not generally support removing a portion of the charge from the floating gate to go from a more programmed state to a lesser one. This means that updated data cannot overwrite existing data and is instead written to a previous unwritten location.

Furthermore erasing is to empty all the charges from the floating gate and generally takes appreciable time. For that reason, it will be cumbersome and very slow to erase cell by cell or even page by page. In practice, the array of memory cells is divided into a large number of blocks of memory cells. As is common for flash EEPROM systems, the block is the unit of erase. That is, each block contains the minimum number of memory cells that are erased together. While aggregating a large number of cells in a block to be erased in parallel will improve erase performance, a large size block also entails dealing with a larger number of update and obsolete data.

Each block is typically divided into a number of physical pages. A logical page is a unit of programming or reading that contains a number of bits equal to the number of cells in a physical page. In a memory that stores one bit per cell (a Single Level Cell, or "SLC" memory), one physical page stores one logical page of data. In memories that store two bits per cell, a physical page stores two logical pages. The number of logical pages stored in a physical page thus reflects the number of bits stored per cell. The term Multi Level Cell, or "MLC" is generally used to refer to memories that store more than one bit per cell, including memories that store three bits per cell (TLC), four bits per cell, or more bits per cell. In one embodiment, the individual pages may be divided into segments and the segments may contain the fewest number of cells that are written at one time as a basic programming operation. One or more logical pages of data are typically stored in one row of memory cells. A page can store one or more sectors. A sector includes user data and overhead data.

MLC Programming

Figures 6A, 6B, 6C:
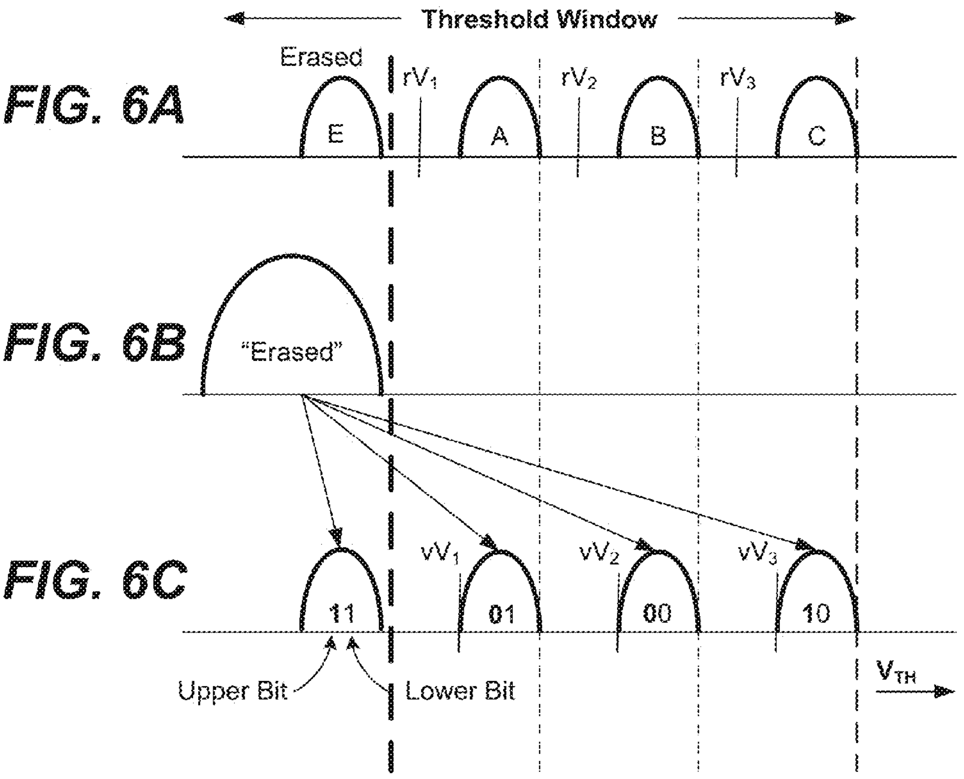
FIGS. 6A-6C illustrate an example of programming a population of memory cells.

FIG. 6A-6C illustrate an example of programming a population of 4-state memory cells. FIG. 6A illustrates the population of memory cells programmable into four distinct distributions of threshold voltages respectively representing memory states "E", "A", "B" and "C". FIG. 6B illustrates the initial distribution of "erased" threshold voltages for an erased memory. FIG. 6C illustrates an example of the memory after many of the memory cells have been programmed. Essentially, a cell initially has an "erased" threshold voltage and programming will move it to a higher value into one of the three zones demarcated by verify levels $vV_1$, $vV_2$ and $vV_3$. In this way, each memory cell can be programmed to one of the three programmed states "A", "B" and "C" or remain un-programmed in the "erased" state. As the memory gets more programming, the initial distribution of the "erased" state as shown in FIG. 6B will become narrower and the erased state is represented by the "0" state.

A 2-bit code having a lower bit and an upper bit can be used to represent each of the four memory states. For example, the "E", "A", "B" and "C" states are respectively represented by "11", "01", "00" and "10". The 2-bit data may be read from the memory by sensing in "full-sequence" mode where the two bits are sensed together by sensing relative to the read demarcation threshold values $rV_1$, $rV_2$ and $rV_3$ in three sub-passes respectively.

3-D NAND Structure

An alternative arrangement to a conventional two-dimensional (2-D) NAND array is a three-dimensional (3-D) array. In contrast to 2-D NAND arrays, which are formed along a planar surface of a semiconductor wafer, 3-D arrays extend up from the wafer surface and generally include stacks, or columns, of memory cells extending upwards. Various 3-D arrangements are possible. In one arrangement a NAND string is formed vertically with one end (e.g. source) at the wafer surface and the other end (e.g. drain) on top. In another arrangement a NAND string is formed in a U-shape so that both ends of the NAND string are accessible on top, thus facilitating connections between such strings.

Figure 7:
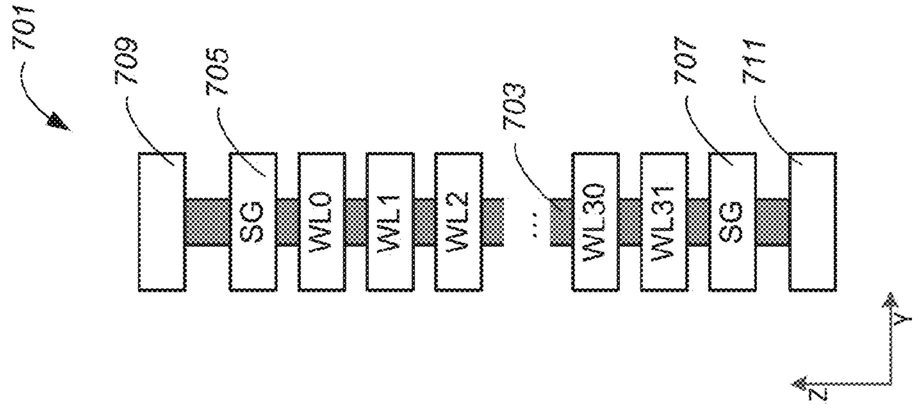
FIG. 7 shows an example of a physical structure of a 3-D NAND string.

FIG. 7 shows a first example of a NAND string 701 that extends in a vertical direction, i.e. extending in the z-direction, perpendicular to the x-y plane of the substrate. Memory cells are formed where a vertical bit line (local bit line) 703 passes through a word line (e.g. WL0, WL1, etc.). A charge trapping layer between the local bit line and the word line stores charge, which affects the threshold voltage of the transistor formed by the word line (gate) coupled to the vertical bit line (channel) that it encircles. Such memory cells may be formed by forming stacks of word lines and then etching memory holes where memory cells are to be formed. Memory holes are then lined with a charge trapping layer and filled with a suitable local bit line/channel material (with suitable dielectric layers for isolation).

As with planar NAND strings, select gates 705, 707, are located at either end of the string to allow the NAND string to be selectively connected to, or isolated from, external elements 709, 711. Such external elements are generally conductive lines such as common source lines or bit lines that serve large numbers of NAND strings. Vertical NAND strings may be operated in a similar manner to planar NAND strings and both Single Level Cell (SLC) and Multi Level Cell (MLC) operation is possible. While FIG. 7 shows an example of a NAND string that has 32 cells (0-31) connected in series, the number of cells in a NAND string may be any suitable number. Not all cells are shown for clarity. It will be understood that additional cells are formed where word lines 3-29 (not shown) intersect the local vertical bit line.

Figure 8:
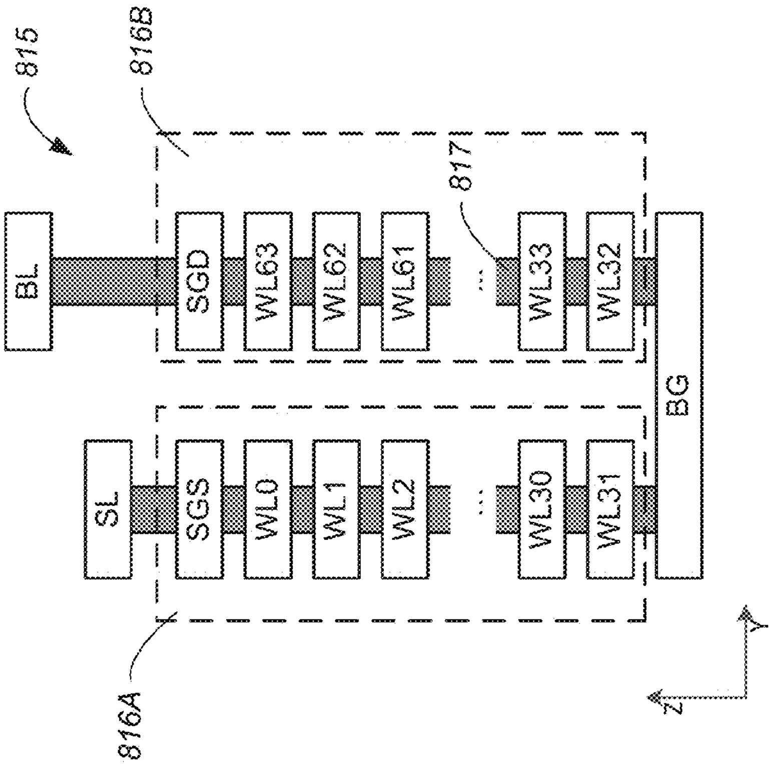
FIG. 8 shows an example of a physical structure of a U-shaped 3-D NAND string.

FIG. 8 shows a second example of a NAND string 815 that extends in a vertical direction (z-direction). In this case, NAND string 815 forms a U-shape, connecting with external elements (source line "SL" and bit line "BL") located on the top of the structure. At the bottom of NAND string 815 is a controllable gate (back gate "BG") which connects the two wings 816A, 816B of NAND string 815. A total of 64 cells are formed where word lines WL0-WL63 intersect the vertical local bit line 817 (though in other examples other numbers of cells may be provided). Select gates SGS, SGD, are located at either end of NAND string 815 to control connection/isolation of NAND string 815.

Figure 9:
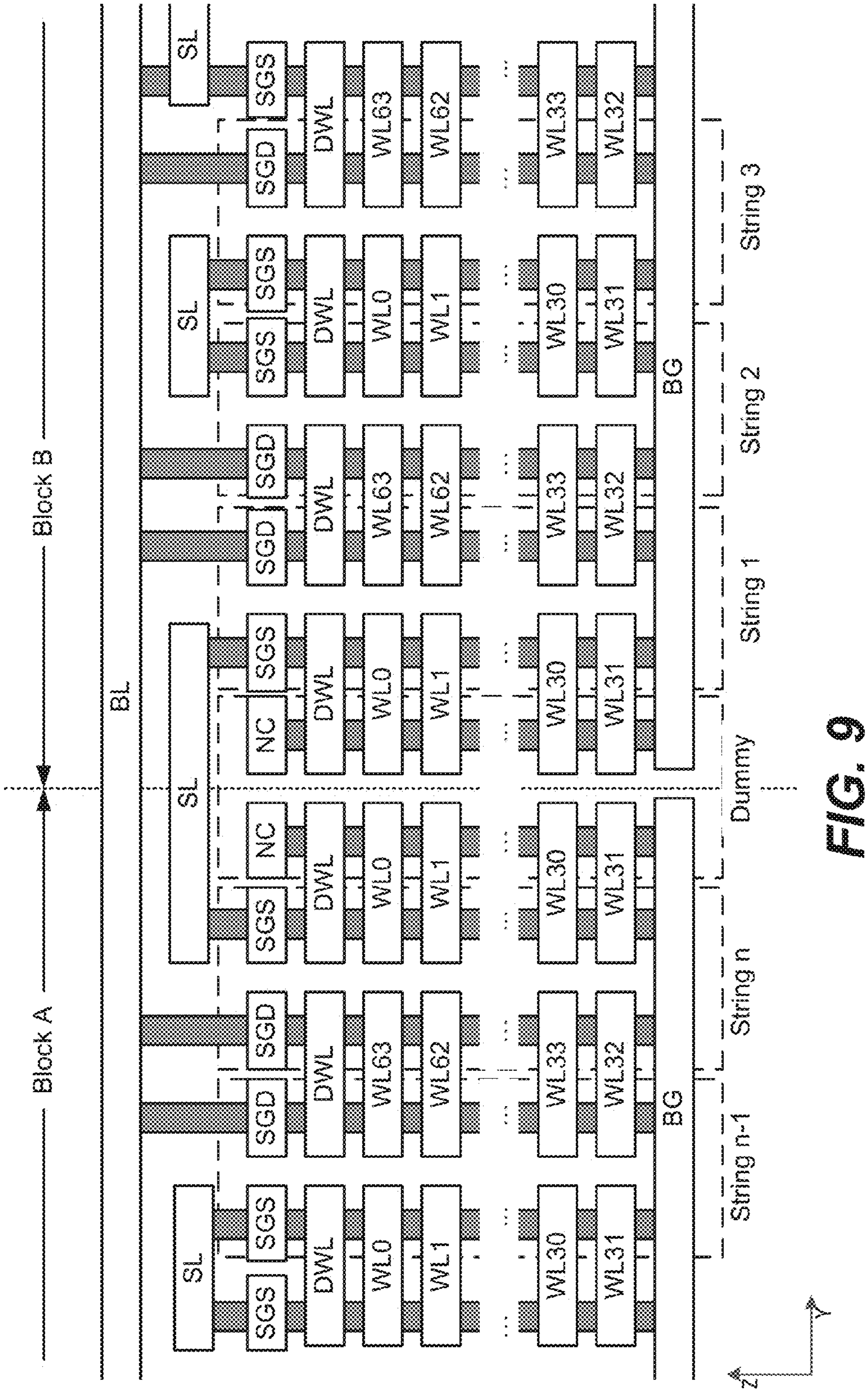
FIG. 9 shows an example of a cross section of a 3-D NAND memory array with U-shaped NAND strings in the y-z plane.

Vertical NAND strings may be arranged to form a 3-D NAND array in various ways. FIG. 9 shows an example where multiple U-shaped NAND strings in a block are connected to a bit line. In this case, there are n separately-selectable sets of strings (Sting 1-String n) in a block connected to a bit line ("BL"). The value of "n" may be any suitable number, for example, 8, 12, 16, 32, or more. Strings alternate in orientation with odd numbered strings having their source connection on the left, and even numbered strings having their source on the right. This arrangement is convenient but is not essential and other patterns are also possible.

Common source lines "SL" connect to one end of each NAND string (opposite to the end that connects to the bit line). This may be considered the source end of the NAND string, with the bit line end being considered as the drain end of the NAND string. Common source lines may be connected so that all source lines for a block may be controlled together by a peripheral circuit. Thus, NAND strings of a block extend in parallel between bit lines on one end, and common source lines on the other end.

Figure 10A:
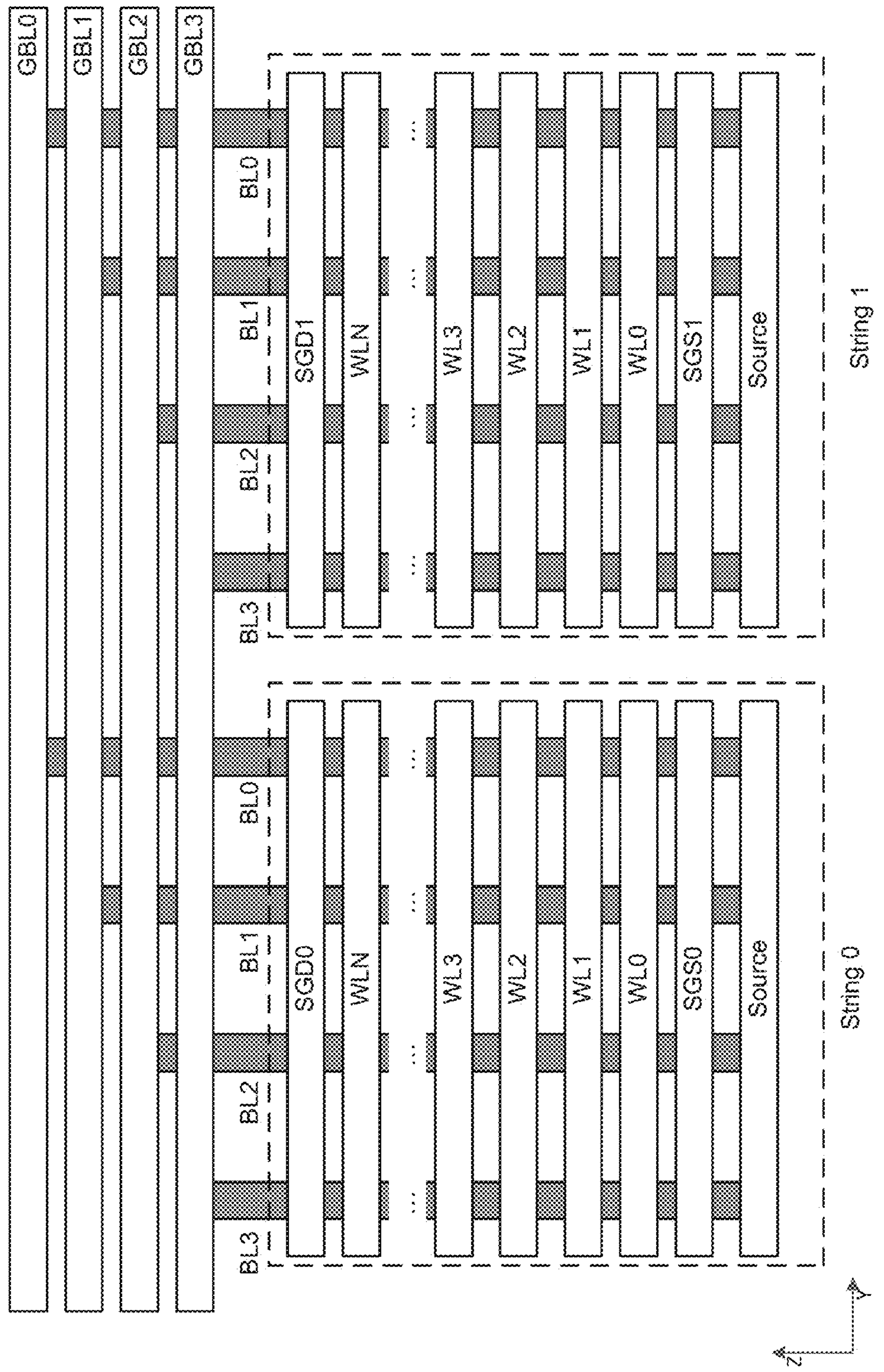
FIGS. 10A-C illustrate an example of a 3-D NAND memory with multiple separately-selectable sets of strings in a block.

FIG. 10A shows a memory structure, in cross section along the bit line direction (along y-direction) in which straight vertical NAND strings extend from common source connections in or near a substrate to global bit lines (GBL0-GBL3) that extend over the physical levels of memory cells. Word lines in a given physical level in a block are formed from a sheet of conductive material. Memory hole structures extend down through these sheets of conductive material to form memory cells that are connected in series vertically (along the z-direction) by vertical bit lines (BL0-BL3) to form vertical NAND strings. Within a given block there are multiple NAND strings connected to a given global bit line (e.g. GBL0 connects with multiple BL0s). NAND strings are grouped into sets of strings that share common select lines. Thus, for example, NAND strings that are selected by source select line SGS0 and drain select line SGD0 may be considered as a set of NAND strings and may be designated as String 0, while NAND strings that are selected by source select line SGS1 and drain select line SGD1 may be considered as another set of NAND strings and may be designated as String 1 as shown. A block may consist of any suitable number of such separately-selectable sets of strings. It will be understood that FIG. 10A shows only portions of GBL0-GBL3, and that these bit lines extend further in the y-direction and may connect with additional NAND strings in the block and in other blocks. Furthermore, additional bit lines extend parallel to GBL0-GBL3 (e.g. at different locations along x-axis, in front of, or behind the location of the cross-section of FIG. 10A).

Figure 10B:
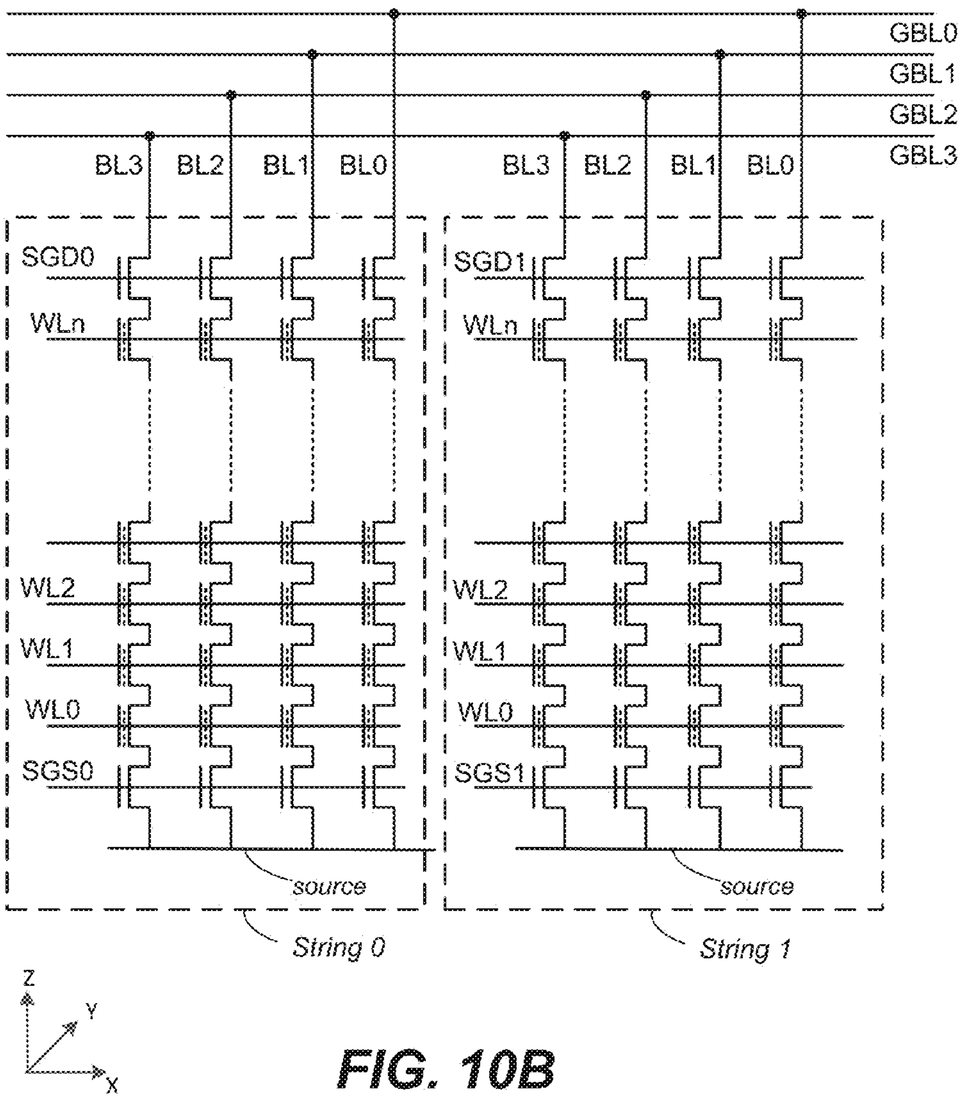

FIG. 10B illustrates separately-selectable sets of NAND strings of FIG. 10A schematically. It can be seen that each of the global bit lines (GBL0-GBL3) is connected to multiple separately selectable sets of NAND strings (e.g. GBL0 connects to vertical bit line BL0 of String 0 and also connects to vertical bit line BL0 of String 1) in the portion of the block shown. In some cases, word lines of all strings of a block are electrically connected, e.g. WL0 in string 0 may be connected to WL0 of String 1, String 2, etc. Such word lines may be formed as a continuous sheet of conductive material that extends through all sets of strings of the block. Source lines may also be common for all strings of a block. For example, a portion of a substrate may be doped to form a continuous conductor underlying a block. Source and drain select lines are not shared by different sets of strings so that, for example, SGD0 and SGS0 can be biased to select String 0 without similarly biasing SGD1 and SGS1. Thus, String 0 may be individually selected (connected to global bit lines and a common source) while String 1 (and other sets of strings) remain isolated from global bit lines and the common source. Accessing memory cells in a block during programming and reading operations generally includes applying select voltages to a pair of select lines (e.g. SGS0 and SGD0) while supplying unselect voltages to all other select lines of the block (e.g. SGS1 and SGD1). Then, appropriate voltages are applied to word lines of the block so that a particular word line in the selected set of strings may be accessed (e.g. a read voltage is applied to the particular word line, while read-pass voltages are applied to other word lines). Erasing operations may be applied on an entire block (all sets of strings in a block) rather than on a particular set of strings in a block.

Figure 10C:
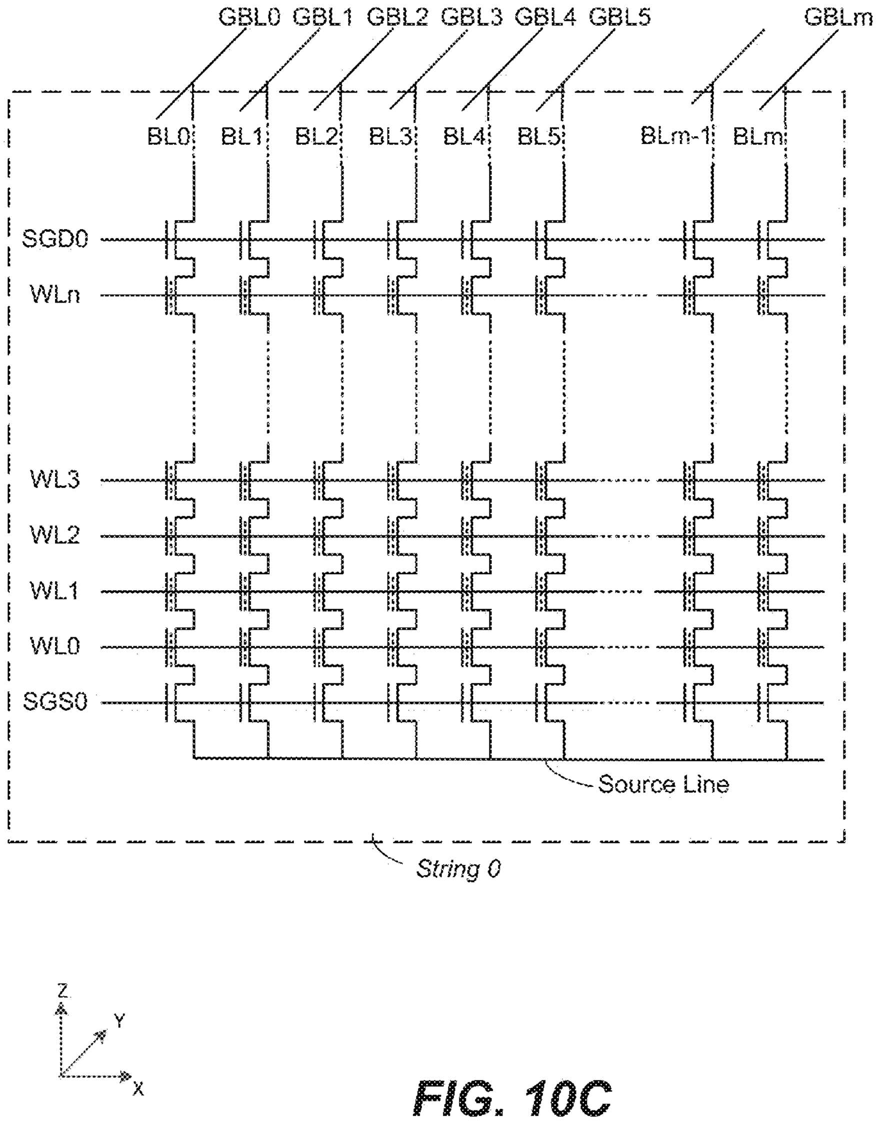

FIG. 10C shows a separately selectable set of NAND strings, String 0, of FIGS. 10A-B in cross section along the X-Z plane. It can be seen that each global bit line (GBL0-GBLm) is connected to one vertical NAND string (vertical bit line BL0-BLm) in String 0. String 0 may be selected by applying appropriate voltages to select lines SGD0 and SGS0. Other sets of strings are similarly connected to global bit lines (GBL0-GBLm) at different locations along the Y direction and with different select lines that may receive unselect voltages when String 0 is selected.

Bad and Partially-Bad Blocks

In some memory systems, bad blocks are detected and are marked so that they are not subsequently used for storage of user data. For example, detection and marking of bad blocks may be performed during factory testing. A bad block may be a block that fails to meet a set of criteria related to, for example, reading, writing, and erasing (e.g. failing to read, write, or erase within time limit), having an excessively high error rate or an excessive number of bad cells, and/or other criteria. If a particular die has more than a threshold number of bad blocks then the die may be discarded. In some cases, dies may be classified according to the number of bad blocks that they contain. Generally, dies with fewer bad blocks are preferable because data storage capacity of the memory is reduced by the number of bad blocks.

In some cases, blocks may have some inoperable components while other components remain operable. For example, one or more column in a block may be found to be inoperable and may be replaced by a spare column. Similarly, one or more rows of memory cells may be replaced in some cases. Small numbers of bad cells may be acceptable if the error rates resulting from such bad cells are low enough to allow correction by Error Correction Code (ECC) or some other form of redundancy.

In an example, blocks with multiple separately-selectable sets of strings that are identified as "bad" blocks are further tested to determine if there are operable sets of strings in the blocks (e.g. some sets of strings may meet test criteria even though the bock as a whole does not meet the criteria). While some failure modes may result in bad blocks that have no operable cells, other failure modes may affect a particular portion of a block and may leave at least some operable memory cells. Some failure modes may affect individual separately-selectable sets of NAND strings within a block while other sets of NAND strings remain operable. For example, a damaged or shorted select line in a particular separately-selectable set of NAND strings may make that set of NAND strings inoperable while other sets of NAND strings in the same block are operable. Testing of blocks identified as "bad" blocks may identify a number of blocks that contain a mix of operable and inoperable sets of strings. In some cases, such partially-bad blocks may subsequently be used to store data thereby increasing the capacity of the memory. Thus, at least some capacity of the partially-bad blocks is recovered or reclaimed thereby providing capacity that would otherwise be lost.

In some cases, partially-bad blocks may identified and may be directly addressed and used to store data. However, such blocks have reduced capacity compared with good blocks. For example, in a block that has four separately-selectable sets of NAND strings, if one set of strings is inoperable then the capacity of the block is reduced by 25%, and if two sets of strings are inoperable then the capacity of the blocks is reduced by 50%. Managing a memory with different sized blocks may require a more complex data management system. In general, it is simpler to operate a block-erasable memory in which each block stores an equal amount of data. Such blocks may be used interchangeably so that logical blocks of data may be assigned to physical blocks in the memory without regard to individual capacities of the blocks.

Virtual Block Formation

Figure 11:
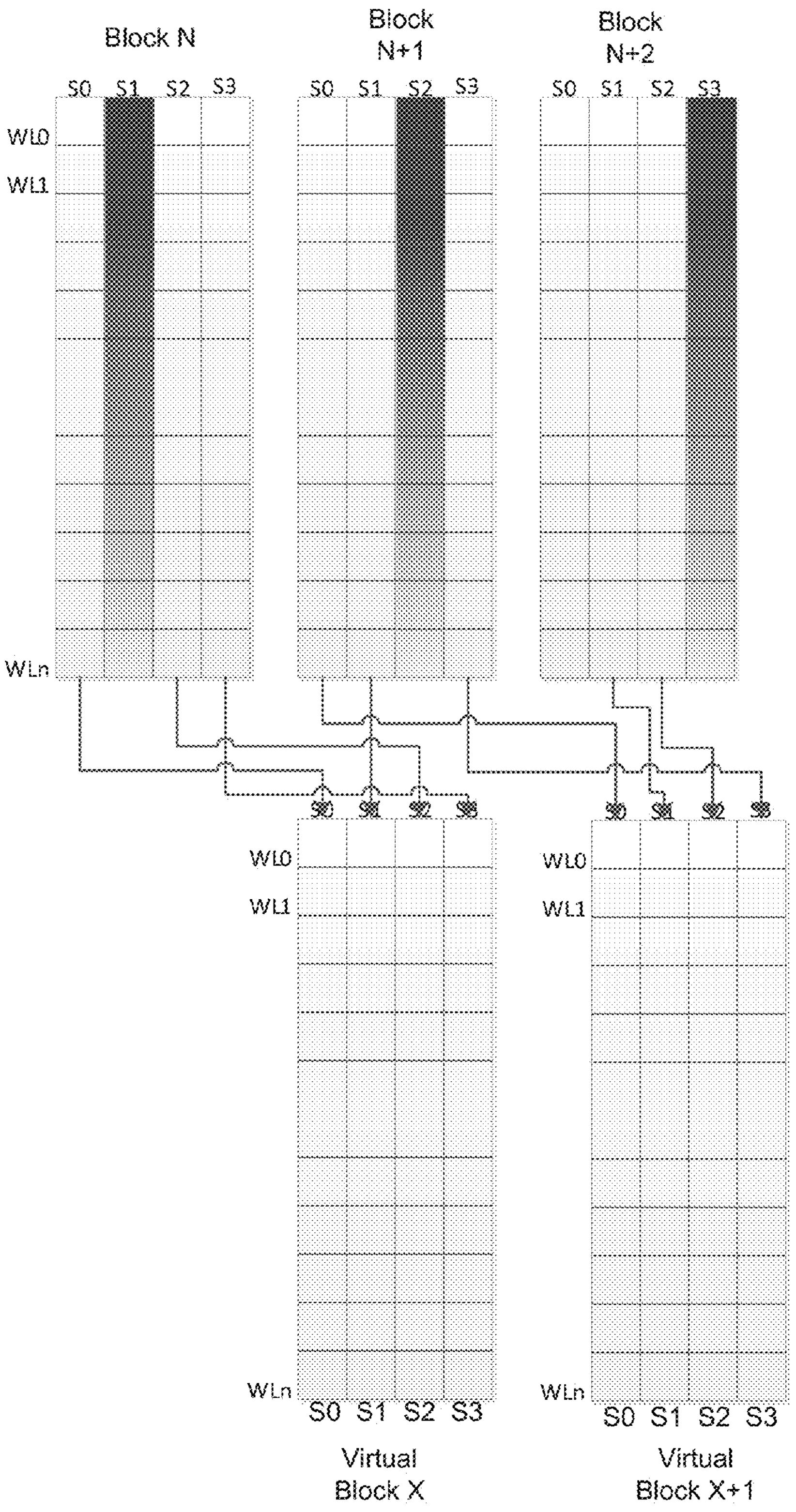
FIG. 11 illustrates formation of virtual blocks.

FIG. 11 illustrates an example in which three partially-bad blocks, Blocks N, N+1 and N+2 are identified. Each of blocks N, N+1, and N+2 contains a single inoperable separately-selectable set of NAND strings. String 1 "S1" of block N, String 2 "S2" of block N+1, and String 3 "S3" of block N+2 are inoperable (shown by shading) while remaining sets of strings in blocks N to N+2 are operable.

In order to maintain a uniform data storage capacity across all blocks, the operable sets of NAND strings in partially-bad blocks N to N+1 are mapped to form two virtual blocks that each have the same capacity as a good block (i.e. a capacity corresponding to four operable sets of strings). Virtual block X is formed of three separately-selectable sets of strings (S0, S2, and S3) of Block N and one separately selectable set of strings (S1) from Block N+1. Virtual block X+1 is formed of two separately-selectable sets of strings (S0 and S3) from Block N+1 and two (S1 and S2) from Block N+2. In some cases, a new address (different to physical addresses of blocks mapped to the virtual block) may be assigned to the virtual block. Such addresses may be reserved for virtual blocks so that virtual blocks are easily identified and may be treated differently (e.g. may be used as reserve, or back-up blocks, used for some special function, or operated in some particular manner). In other cases, a virtual block may simply be assigned the physical address of one of the partially-bad blocks mapped to it. For example, virtual block X may use the physical address of block N. Thus, only one string needs to be remapped (i.e. S0, S2, and S3 are addressed by the physical address of block N, while S1 is remapped from Block N+1).

It can be seen that the example of FIG. 11 increases memory capacity by two blocks by using operable sets of strings in partially-bad blocks that would otherwise be discarded. Memory capacity may be increased significantly by such virtual blocks where bad blocks have significant numbers of operable sets of strings. The amount of capacity that can be reclaimed in this way depends on the particular failure modes that are present in the bad blocks (i.e. number of partially-bad blocks with at least some operable sets of strings). In some cases, all operable sets of strings are mapped to virtual blocks for subsequent use to store user data. In other cases, only partially-bad blocks with more than a threshold number of good sets of strings may be mapped to virtual blocks. For example, more than two inoperable sets of strings may indicate that a block is likely to have significant problems so that any operable sets of strings are not used because of the high risk of failure. In some cases, only partially-bad blocks with a single bad set of strings are mapped to virtual blocks.

Block capacity remains uniform from the memory management perspective because virtual blocks are formed to have the same capacity as good blocks (even though partially-bad blocks mapped to virtual blocks have reduced capacity). Subsequent access to virtual blocks (e.g. programming, writing, and erasing) results in redirection to good sets of strings in the partially-bad blocks that are mapped to the virtual block. Thus, a relatively simple mapping scheme may be used. For example, where a logical-to-physical addressing scheme is used, virtual block addresses may appear as physical block addresses (i.e. logical block addresses may be recorded as stored at virtual block addresses) even though virtual block addresses are not true physical addresses of individual blocks in the memory.

Mapping to form virtual blocks may occur at any suitable time. In some cases, bad blocks are identified during testing (e.g. factory testing) prior to storage of user data, and prior to assembly of memory systems from such dies. Mapping may be performed after such memory systems are assembled. For example, a memory controller in such a memory system may perform mapping after firmware download as part of an initialization procedure. Such mapping may then remain constant throughout the life of the product. In other cases, mapping may be performed at one or more time after initialization. For example, if a block becomes bad during use, such a block may be added to a bad block list. However, if there are operable sets of strings in blocks added to a bad block list, these operable sets of strings may be mapped to virtual blocks so that the capacity loss is diminished (i.e. the entire block is not discarded). If additional sets of strings become inoperable in a partially-bad block then remapping may be performed so that the newly-inoperable set of strings is replaced in its virtual block.

It will be understood that in addition to the partially-bad blocks illustrated in FIG. 11, there will be good blocks in which all sets of strings are operable and there will generally be bad blocks that have no operable sets of strings. Such bad blocks may be managed in any suitable manner. For example, a bad block list may be maintained so that bad blocks are not accessed. Such bad blocks may be excluded from any list of good blocks (e.g. erased-block list). A partially-bad block scheme may operate in conjunction with any suitable bad block scheme.

Mapping sets of strings to form virtual blocks may use any suitable mapping scheme. For example, sets of strings may be mapped so that a virtual block has one set of strings from each string position. FIG. 11 shows virtual blocks X and X+1 containing one set of strings from each physical position (i.e. S0, S1, S2, and S3 positions). In other examples, sets of strings may be mapped to virtual blocks without regard to the physical positions of the sets of strings in their physical blocks. Thus, a virtual block might have multiple sets of strings from one position (e.g. two from S0 position) and none from another position (e.g. none from S1 position).

Figure 12:
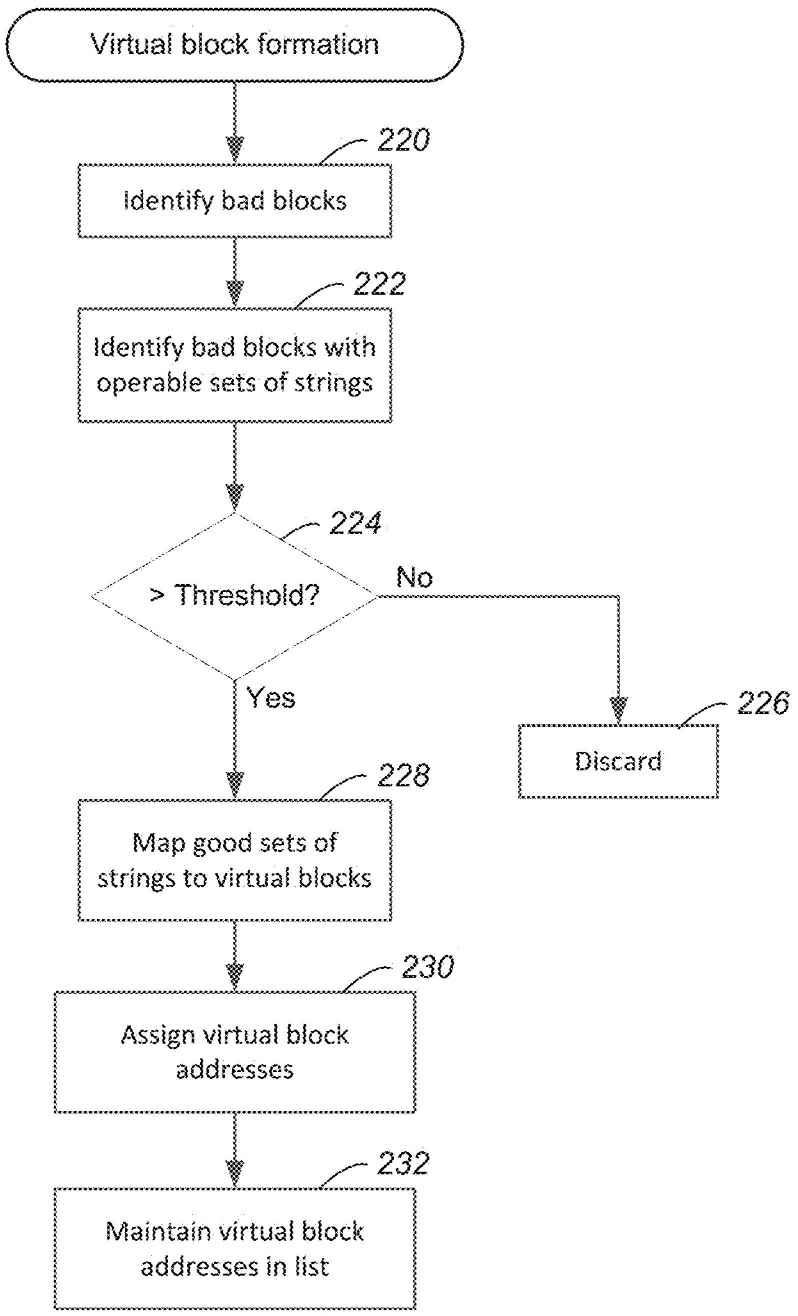
FIG. 12 illustrates a virtual block formation scheme.

FIG. 12 illustrates an example of virtual block formation. Bad blocks are identified 220, e.g. during factory testing. Subsequently, operable sets of strings within bad blocks are identified 222 so that usable capacity in these partially-bad blocks may be recovered. This may occur after assembly of a memory system, for example, after one or more memory dies are assembled with a memory controller and the memory controller firmware is downloaded. The number of operable sets of strings is compared with a threshold number 224 and if the number is less than the threshold then the block may be discarded 226 (e.g. may be considered a bad block and may not be used for storage of user data). If the number of operable sets of strings exceeds the threshold then operable sets of string in the block are mapped to one or more virtual blocks 228. These steps may be applied to all bad blocks so that operable memory in such partially-bad blocks is fully identified. Operable sets of strings are then mapped to virtual blocks 228 according to a mapping scheme. Virtual block addresses are assigned to the virtual blocks 230. Virtual block addresses may be unique block addresses that may be from a range of block addresses that are reserved for such virtual blocks. Virtual block addresses are then maintained in a list 232, which may be a list that is exclusively for virtual blocks, or may be a list that includes both virtual blocks and good blocks.

Virtual Block Operation

Virtual blocks may be operated in any suitable manner. In some examples, virtual blocks may be added to a list of good blocks (e.g. added to an erased-block list during initialization) and may be operated in an identical manner to good blocks (e.g. used to store user data with the same level of redundancy, same storage format, etc.) so that virtual blocks are interchangeable with good blocks. In other examples, virtual blocks may be operated differently in one or more ways.

Because virtual blocks include sets of strings that are physically located in physical blocks that contain defects (at least one inoperable set of strings), data stored in virtual blocks may have higher error rates and may have a higher risk of being lost than data stored in good blocks. Various measures may be used to address such differences.

In one example, a redundancy scheme may be applied to data stored in virtual blocks that provides greater capacity to correct any errors occurring in virtual blocks. For example, data stored in virtual blocks may use an Error Correction Code (ECC) scheme that provides a higher level of redundancy than an ECC scheme used in good blocks. Data in virtual blocks may be subject to an exclusive OR (XOR) operation prior to storage to generate redundant data so that any lost data may be reproduced by reversing the XOR operation.

In nonvolatile memories, data may be stored in different formats with different error rates. For example, data may be stored in SLC format (one bit per cell) and in MLC format (more than one bit per cell), where SLC format generally has a lower error rate because of the wider margins associated with memory states. Data stored in virtual blocks may be stored in only SLC format to reduce error rates. Good blocks may store data in MLC format, or a mix of SLC and MLC formats. In some examples, different MLC schemes may be used. Generally, storing more bits per cell results in higher error rates. Virtual blocks may be limited to storing data in a relatively low density MLC format (e.g. two bits per cell) while good blocks may store data in a higher density MLC format (e.g. three or more bits per cell).

Virtual blocks may be limited to particular functions. For example, virtual blocks may be held in reserve and may only be used when there are no good blocks available. Thus, virtual blocks may extend the life of a memory that would otherwise fail. Such virtual blocks may not be subject to write-erase cycling until other blocks have failed so that they are not subject to normal wear (thereby reducing the risk of wear-related failure). Virtual blocks may be used as scratch-pad blocks that store small portions of data used by a memory controller for relatively short periods of time and not for extended periods.

Operating a virtual block may be similar to operating a good block but with any accessing operations redirected to the physical locations that are mapped to the virtual block. Read and write operations proceed as in good blocks with the address to be read or written being redirected according to the mapping. Erase operations may be somewhat different because erasing a virtual block includes erasing at least two physical blocks in the memory. When a virtual block contains only obsolete data, the virtual block may be marked as obsolete and subsequently two or more erase operations may be carried out on the two or more physical blocks containing the sets of strings of the virtual block. The operation may occur after all data in such a partially-bad block is obsolete. Because partially-bad blocks may contain data from more than one virtual block, erase of a partially-bad block may not occur immediately when corresponding virtual block becomes obsolete (i.e. there may still be valid data from another virtual block in the partially-bad block so that erase may be delayed until such valid data becomes obsolete).

Figure 13:
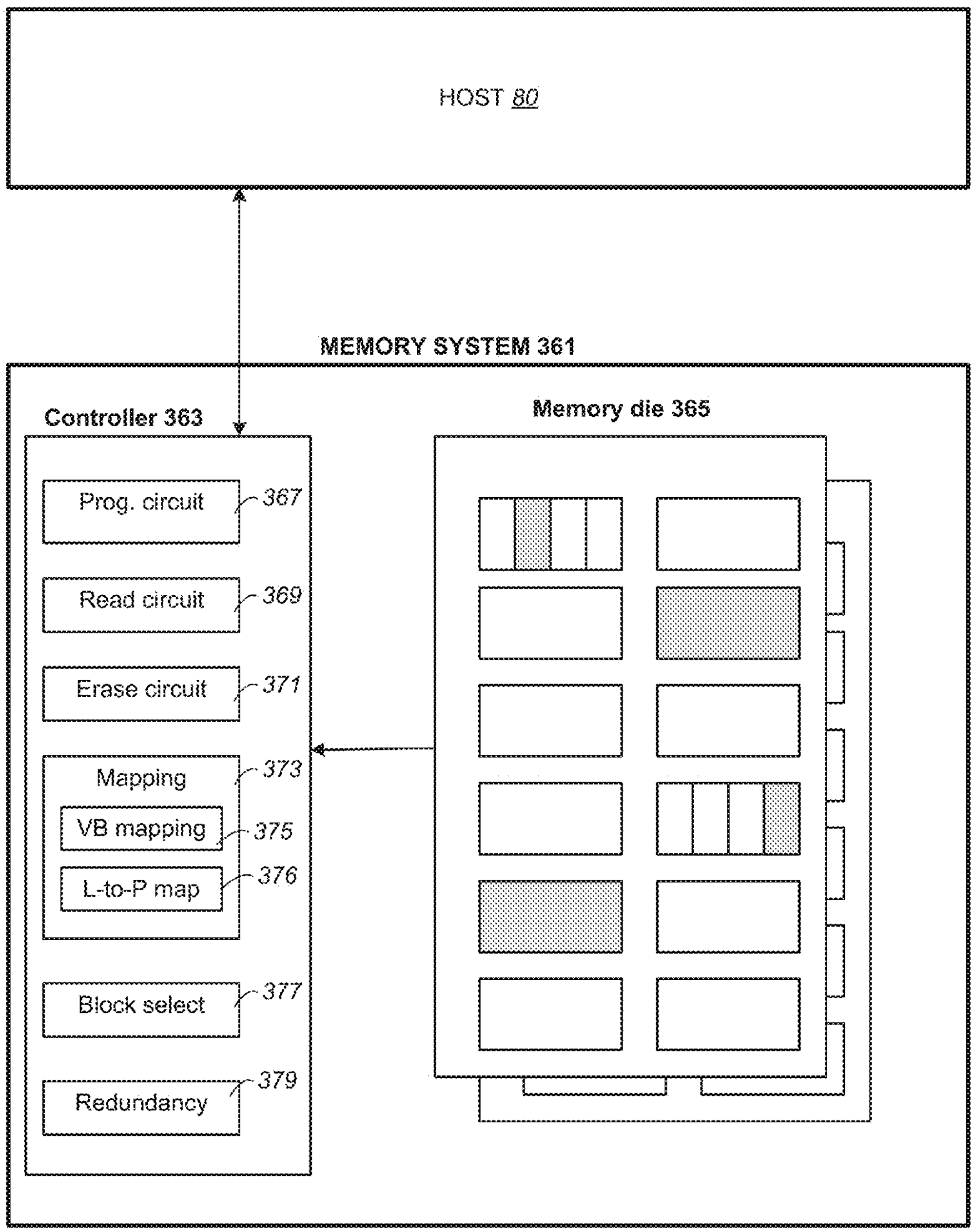
FIG. 13 shows an example of a memory system.

FIG. 13 illustrates an example of a memory system 361 in communication with a host 80. For example memory system 361 may be a memory card, or USB flash drive that is removably connected to host 80 (e.g. camera, music player, laptop) through a standardized interface. Memory system 361 may be a solid state drive and host 80 may be a tablet, laptop, or similar device. Memory system 361 includes multiple memory dies; including memory die 365, and a memory controller 363. Memory die 365 includes a number of individually erasable blocks that are categorized as bad (shaded), good (unshaded), and partially bad (partially shaded). Memory controller 365 includes program (write) circuit 367, read circuit 369, and erase circuit 371 (additional program, write, and erase circuits may be located as peripheral circuits on memory die 365). Mapping unit 373 includes a virtual block mapping "VB mapping" unit 375 that maps operable sets of NAND strings in partially-bad blocks to virtual blocks and assigns virtual block addresses to the virtual blocks. A list of such virtual blocks may be maintained and/or virtual blocks may be added to a list that includes good blocks. Logical-to-physical map 376 records locations where logical blocks of data are stored in memory die 365 on a block-by-block basis with a logical block having a fixed size that is equal to the capacity of one good physical block. Logical-to-physical map 376 may show logical blocks of data stored in good blocks and virtual blocks (not bad blocks), i.e. virtual blocks may appear as physical blocks for purposes of logical-to-physical mapping, with virtual block mapping unit 375 redirecting access to virtual block addresses to corresponding addresses of partially-bad blocks in memory die 365. Thus, logical-to-physical mapping remains one-to-one, while more complex mapping (e.g. one virtual block to multiple partially-bad physical blocks) is performed for virtual blocks by virtual block mapping unit 375. A block select unit 377 selects blocks for storage of data (e.g. when new data is received from host 80). Block select unit 377 may select either a good block or a virtual block according to a suitable scheme (e.g. may treat good and virtual blocks equally, or may apply particular criteria to choose either one). Redundancy unit 379 (e.g. ECC encoder/decoder) provides variable redundancy when storing data so that a higher degree of redundancy may be provided for data stored in virtual blocks compared with data stored in good blocks.

CONCLUSION

The foregoing detailed description has been presented for purposes of illustration and description. It is not intended to be exhaustive or to limit the attached claims. Many modifications and variations are possible in light of the above teaching.

It is claimed:

1. A method of operating a 3-D block-erasable nonvolatile memory formed in a plurality of levels of memory cells disposed above a substrate, each block having n separately-selectable sets of NAND strings connected in parallel, the method comprising:

identifying a plurality of partially-bad blocks, each partially-bad block having one or more inoperable separately-selectable sets of NAND strings and one or more operable separately-selectable sets of NAND strings;

identifying operable sets of NAND strings within the partially-bad blocks;

mapping operable separately-selectable sets of NAND strings from two or more blocks to form one or more virtual blocks, each virtual block consisting of n separately-selectable sets of NAND strings;

assigning virtual block addresses individually to the one or more virtual blocks; subsequently, maintaining the virtual block addresses in a list;

subsequently, accessing the virtual blocks by the virtual block addresses, wherein the memory further includes good blocks that contain only operable separately-selectable sets of NAND strings and the memory further includes bad blocks that contain more than a threshold number of inoperable separately-selectable sets of NAND strings; and maintaining a logical-to-physical map for data stored in the memory, the logical-to-physical map including an entry for each good block, an entry for each partially-bad block, and no entry for any bad block.

2. The method of claim 1 wherein the list is an available block list that includes addresses of the good blocks, the good blocks and the virtual blocks being equally available for storage of data.

3. The method of claim 1 wherein data is stored in the virtual blocks using a first redundancy scheme and data is stored in the good blocks using a second redundancy scheme, the first redundancy scheme having greater error correction capacity than the second redundancy scheme.

4. The method of claim 1 wherein data is stored in the virtual blocks in single level cell (SLC) format only and data is stored in at least some of the good blocks in multi-level cell (MLC) format.

5. The method of claim 1 wherein an individual virtual block is marked obsolete as a unit and is subsequently erased in a plurality of erase operations directed to the partially-bad blocks containing the separately-selectable sets of NAND strings forming the individual virtual block.

6. The method of claim 1 wherein the list is a list of scratch-pad blocks that are used only for short-term storage of small portions of data that are later copied to other locations.

7. A method of operating a 3-D nonvolatile memory formed in a plurality of levels of memory cells disposed above a substrate that are erasable in physical blocks, each physical block having n separately-selectable sets of vertical NAND strings, the method comprising:

identifying a plurality of partially-bad blocks from among blocks failing to meet test criteria, each partially-bad block having one or more inoperable separately-selectable sets of NAND strings and one or more operable separately-selectable sets of NAND strings;

identifying operable sets of NAND strings within the partially-bad blocks;

mapping operable separately-selectable sets of NAND strings from two or more blocks to form a virtual block, the virtual block consisting of n separately-selectable sets of NAND strings;

assigning a virtual block address to the virtual block;

subsequently, maintaining the virtual block address in a spare block list; and subsequently, accessing the virtual block by the virtual block address only when blocks meeting test criteria are not available, wherein the n separately-selectable sets of vertical NAND strings of a physical block are physically ordered from position 1 to n and the separately-selectable sets of vertical NAND strings forming the virtual block are selected without regard to physical position.

8. The method of claim 7 wherein the n separately-selectable sets of vertical NAND strings of a physical block are physically ordered from position 1 to n and the separately-selectable sets of vertical NAND strings forming the virtual block are selected to include one separately-selectable set of vertical NAND strings from each position 1 to n.

9. The method of claim 7 wherein data is stored in the virtual block in a lower density format than data stored in blocks that meet test criteria.

10. The method of claim 7 wherein data is stored in the virtual block with a higher degree of redundancy than data stored in blocks that meet test criteria.

11. A nonvolatile memory system comprising:

a three-dimensional nonvolatile memory array that is monolithically formed in a plurality of physical levels of memory cells disposed above a substrate, and including a plurality of separately-erasable physical blocks, each physical block having n separately-selectable sets of vertical NAND strings;

a first subset of the plurality of physical blocks that meet predetermined criteria;

a second subset of the plurality of physical blocks that fail to meet the predetermined criteria;

a third subset of the plurality of physical blocks that fail to meet the predetermined criteria, and are each found to contain at least one operable separately-selectable set of vertical NAND strings;

a plurality of virtual blocks, an individual virtual block formed from operable separately-selectable sets of vertical NAND strings from two or more blocks from the third subset of the plurality of physical blocks, each virtual block having a unique virtual block address; and a mapping unit that maps virtual block addresses to the separately-selectable sets of vertical NAND strings that form the virtual block so that access operations directed to a virtual block address are remapped to the separately-selectable sets of vertical NAND strings that form the virtual block.

12. The memory system of claim 11 wherein the n separately-selectable sets of vertical NAND strings of a physical block are physically ordered from position 1 to n and the separately-selectable sets of vertical NAND strings forming the virtual block include one separately-selectable set of vertical NAND strings from each position 1 to n.

13. The memory system of claim 11 further comprising a block selection unit that selects an available block for storage of new data, the block selection unit configured to only select virtual blocks when no block from the first subset of the plurality of blocks is available.

14. The memory system of claim 11 further comprising a redundancy unit configured to encode data with redundancy prior to storage, the redundancy unit configured to apply a lower level of redundancy to data stored in the first subset of the plurality of physical blocks and configured to apply a higher level of redundancy to data stored in the third subset of the plurality of physical blocks, the higher level of redundancy having capacity to correct a higher number of errors than the lower level of redundancy.

15. The memory system of claim 14 wherein the three-dimensional nonvolatile memory array is located on a first die, and the mapping unit and the redundancy unit are located on a second die.

16. The memory system of claim 15 wherein the first die and the second die are mounted on a printed circuit board in a memory system that is: a universal serial bus (USB) memory, a memory card, or a solid state drive.

* * * * *